United States Patent [19]

Kishi et al.

[11] Patent Number: 4,663,494
[45] Date of Patent: May 5, 1987

[54] PHOTOVOLTAIC DEVICE

[75] Inventors: Yasuo Kishi; Hiroyuki Taniguchi, both of Osaka, Japan

[73] Assignee: Sanyo Electric Co., Ltd., Japan

[21] Appl. No.: 755,054

[22] Filed: Jul. 12, 1985

[30] Foreign Application Priority Data

Jul. 19, 1984 [JP] Japan ................... 59-149953
Jul. 20, 1984 [JP] Japan ................... 59-151704
Jul. 20, 1984 [JP] Japan ................... 59-151705
Jul. 20, 1984 [JP] Japan ................... 59-151706

[51] Int. Cl.$^4$ .......................................... H01L 27/14
[52] U.S. Cl. .................... 136/244; 136/258; 29/572
[58] Field of Search ............... 136/244, 258 AM

[56] References Cited

U.S. PATENT DOCUMENTS 4,292,092  9/1981  Hanak ............................ 148/1.5
4,542,578  9/1985  Yamano et al. .................. 29/572

FOREIGN PATENT DOCUMENTS 56-13779   2/1981  Japan ..................... 136/258 AM
59-65488   4/1984  Japan ..................... 136/258 AM
59-65489   4/1984  Japan ..................... 136/258 AM
59-103383  6/1984  Japan ..................... 136/258

Primary Examiner—Aaron Weisstuch
Attorney, Agent, or Firm—Darby & Darby

[57] ABSTRACT

The present invention consists of a photovoltaic device and a method of manufacturing thereof, in which first electrode films (12a, 12b, 1 and 12c) are separately disposed on a plurality of regions (A, B, and C) of the insulated surface of a substrate (10) and semiconductor photoactive film layers (13) and second electrode films (14) are placed in an overlapping manner on the respective first electrode films. The portions of the semiconductor photoactive layers (13) located in the spacing regions (ab and bc) of the respective second electrode films (14) are removed by etching so that a first electrode film (12a) in one adjacent region is partially exposed. The exposed portion (142a) of the contact face of the second electrode film (14a) with the semiconductor photoactive layer (13a) undercut as the result of etching of the semiconductor photoactive layers (13) is removed by etching so that the exposed portion (12ba) of the first electrode film (12a) and the second electrode film (14a) in the other adjacent region are electrically connected by a connection electrode film (6ab).

18 Claims, 15 Drawing Figures

PHOTOVOLTAIC DEVICE

BACKGROUND OF THE INVENTION

1. Field of the Invention

The present invention relates to a photovoltaic device and a method of manufacturing thereof. More particularly, the present invention relates to a photovoltaic device such as a solar cell and a method of manufacturing thereof, by which light energy is converted directly to electric energy.

2. Description of the Prior Art

In the prior art, U.S. Pat. No. 4,281,208 is known as a photovoltaic device in which semiconductor photoactive film layers divided into a plurality of regions on the insulated surface of a substrate are respectively interposed between first and second electrode films to form a plurality of photoelectric conversion elements, which are electrically connected.

On the other hand, the applicant of the present invention filed Japanese Patent Application No. 213168/1982 (Japanese Patent Laying-Open Gazette No. 103383/1984) and U.S. Patent Application Ser. No. 617,724 filed June 6, 1984 concerning a manufacturing method most suitable for a photovoltaic device having the above described structure.

FIGS. 1 to 3 are cross-sectional views showing steps of a method of manufacturing of a conventional photovoltaic device and FIGS. 4 and 5 are enlarged sectional views showing an essential portion of a conventional photovoltaic device.

First, referring to FIGS. 1 to 5, a method of manufacturing of a conventional photovoltaic device will be described. As shown in FIG. 1, first, a semiconductor photoactive film layer 3 is provided over the whole area including the surfaces of the first electrode films 2a, 2b and 2c and the insulated surface of a substrate 1, the first electrode films 2a, 2b and 2c being disposed at predetermined distances. Then, a second electrode film 4 is formed over the whole surface of the semiconductor photoactive layer 3 without dividing the semiconductor photoactive layer 3 into the regions A, B and C.

Subsequently, as shown in FIG. 2, the second electrode film portions 4' and the semiconductor photoactive layer portions 3' located in the spacing regions ab and bc of the respective adjacent regions A, B and C are removed by etching so that second electrode films 4a, 4b and 4c and semiconductor photoactive layers 3a, 3b and 3c are individually separated.

Then, as shown in FIG. 3, connection electrode films 6a and 6b are selectively evaporated by using a mask so that the first electrode films 2b and 2c of the regions B and C are exposed on one side in the spacing regions ab and bc and these exposed portions 2ba and 2cb are electrically connected respectively to the second electrode films 4a and 4b of the adjacent regions A and B.

By the above described manufacturing method, photoelectric conversion elements A B and C comprising a laminated structure of first electrode films 2a, 2b and 2c, semiconductor photoactive layers 3a, 3b and 3c and second electrode films 4a, 4b and 4c, respectively are formed. The connection electrode films 6a and 6b for electrically connecting in series the photoelectric conversion elements A, B and C in the spacing regions ab and bc are sometimes incompletely evaporated which, causes a rupture in an intermediate slanted portion because if the spacing region ab is taken for example as shown in FIG. 4, the connection electrode film 6a needs to cover a sharp height difference H arising as the sum of the thickness $t_1$ of the semiconductor photoactive layer 3a and the thickness $t_2$ of the second electrode film 4a. Such ruptures would occur more frequently if the connection electrode films 6a and 6b are made of a hard material.

Further, in the above described manufacturing method, as shown in FIG. 5 in an enlarged manner by taking the spacing region ab as an example, the faces 31a and 31b of the semiconductor photoactive layer portion 3' are excessively overetched. More specifically, prior to the masked evaporation of the connection electrode films 6a and 6b, an etching process is applied to the semiconductor photoactive layer portions 3' located in the spacing regions ab and bc. In this process, the faces 31a and 31b of the semiconductor photoactive layer portions 3' are overetched to a larger extent than the faces 41a' and 41b' of the etched second electrode film portions 4'. As a result, the contact faces of the second electrode films 4a and 4b facing the semiconductor photoactive layers 3a and 3b are undercut.

A photoresist film 5 is coated on the second electrode films 4a and 4b, so that the etchant can be prevented from penetrating into the portions of the second electrode films 4a and 4b not intended to be subjected to the etching process. The photoresist film 5 is removed immediately after the completion of the etching process. However, it was observed that at the time of removing the photoresist film 5, the edge portions 41a and 41b of the second electrode films 4a and 4b are curled upward due to the internal stress of the second electrode films 4a and 4b. Such undercutting due to overetching occurs to a greater or lesser extent both in a wet etching process using an etching liquid and in a dry etching process such as plasma etching by glow discharge in an atmosphere of etching gas. If such undercutting occurs due to overetching, a rupture might be caused in the intermediate slanted portions and the like of the connection electrode films 6a and 6b in the same manner as described above in connection with FIG. 4.

Further, if the edge portions 41a and 41b of the second electrode films 4a and 4b are curled, the connection electrode films 6a and 6b cannot be brought into contact with the slanted concave faces 31a and 31b of the semiconductor photoactive layers 3a and 3b respectively, even if the connection electrode films 6a and 6b extend over the curled edge portions 41a and 41b toward the exposed portions 2ba and 2cb of the first electrode films 2b and 2c in the spacing regions ab and bc, respectively, without being ruptured. As a result, a gap is formed between the connection electrode films 6a and 6b and the faces 31a and 31b and consequently, the slanted portions of the connection electrode films 6a and 6b are in a floating state and these slanted portions as well as the curled edge portions 41a and 41b cause the mechanical strength to be decreased. Accordingly, instance of rupture in the case where the edge portions 41a and 41b of the second electrode films 4a and 4b are curled occur with an extremely high frequency as compared with the case in FIG. 4.

SUMMARY OF THE INVENTION

Therefore, a primary object of the present invention is to provide a photovoltaic device and a method of manufacturing thereof, by which rupture of the electrode films for electrically connecting the exposed portions of the first electrode films to the second electrode films can be prevented and thus, the manufacturing yield can be improved.

In a method of manufacturing of a photovoltaic device in accordance with the present invention, first electrode films are separately disposed on a plurality of regions of a substrate and a semiconductor photoactive film layer is provided over the whole area of the first electrode films and the spaces inbetween. Subsequently, second electrode films are separately disposed corresponding to the plurality of regions of the semiconductor photoactive layer and the portions of the semiconductor photoactive layer located in the spacing regions of the respective adjacent second electrode films are removed by etching through the openings of a mask placed on the second electrode films. Thus, the first electrode film in one of the adjacent regions is partially exposed and the exposed portion of the second electrode film undercut as the result of etching of the semiconductor photoactive layer is removed by etching using the mask utilized in the above stated etching process, so that the exposed portion of the first electrode film in one of the adjacent regions and the second electrode film in the other adjacent region can be electrically connected.

In view of the problems in the prior art, in this invention, the portions of the semiconductor photoactive layer located in the spacing regions of the second electrode film are removed by etching through the openings of a mask placed on the second electrode film and using this mask, etching is applied to the second electrode film. By this etching, the portion of the second electrode film exposed as the result of the overetching of the semiconductor photoactive layer, is also removed by etching. Thus, the curled portions of the edge portions of the second electrode films can be removed and connection between the respective adjacent first electrode films and second electrode films over these edge portions will never cause a rupture and therefore, the respective adjacent first and second electrode films can be electrically connected in good condition. As a result, the yield of manufacturing of a photovoltaic device can be improved.

In a preferred embodiment of the present invention, a thick photosensitive photoresist film placed on one surface of a base film as a mask is attached on the second electrode film to form a laminated structure and the portions of the semiconductor photoactive layer located in the spacing regions of the second electrode film are removed by etching. This photoresist film is suited for large area etching and can be easily attached by a simple process.

The first or second electrode film is formed of a transparent oxide material or aluminum and an acid-resisting metal is used for the connection surface of the connection electrode film.

Thus, since in a preferred embodiment of the present invention, the first or second electrode film is formed of aluminum having a low melting point, the electrode film is in good ohmic contact with the semiconductor photoactive layer and the materials cost can be reduced.

In another method of manufacturing of this invention, first electrode films are separately disposed on a plurality of regions of the surface of a substrate and a semiconductor photoactive film layer is provided over the plurality of first electrode films, and second electrode films are separately disposed corresponding to the plurality of regions of the semiconductor photoactive layer. Then, the portions of the semiconductor photoactive layer located in the spacing regions of the second electrode films are removed by application of an energy beam so that the first electrode film in one of the adjacent regions is partially exposed and each exposed portion is electrically connected to the second electrode film in the other adjacent region.

Thus, in the above stated another manufacturing method of the present invention, the energy beam applied to the portions of the semiconductor photoactive layer located in the spacing regions of the respective second electrode films serves to remove only the portions of the semiconductor photoactive layer present in the irradiated regions and as a result, the semiconductor photoactive layer can be divided without undercutting the boundary faces of the second electrode films. In consequence, rupture can be prevented at the time of electrically connecting the exposed portions of the first electrode films and the adjacent second electrode films, which makes it possible to improve the yield of manufacturing.

In a preferred embodiment of another manufacturing method of this invention, the width of each removed portion of the semiconductor photoactive layer is made smaller than the spacing of the respective adjacent second electrode films and consequently, a short circuit can be prevented between the respective first and second electrode films constituting one photoelectric conversion element and a sharp height difference can be ameliorated by dividing it in to a plurality small steps.

In a photovoltaic device in accordance with the present invention, a plurality of photoelectric conversion elements each comprising a first electrode film, a semiconductor photoactive layer and a second electrode film are formed on a substrate. In each spacing region between the adjacent photoelectric conversion elements, one end of a connection electrode film is joined to the second electrode film of one photoelectric conversion element and the connection electrode film extends downward along the exposed side face of the semiconductor photoactive layer from the second electrode film of this element to contact the exposed portion of the first electrode film of the adjacent photoelectric conversion element so that the respective adjacent photoelectric conversion elements are electrically connected in series.

Therefore, in a photovoltaic device in accordance with the present invention, the height difference between the respective first and second electrode films can be reduced in each spacing region by making each connection electrode film extend downward along the end face of the semiconductor photoactive layer of the photoconversion element. Thus, the respective adjacent photoconversion elements can be electrically connected in series without causing a rupture due to a sharp height difference.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
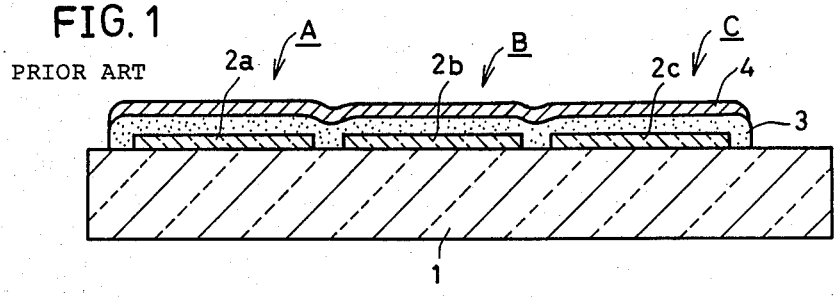
FIGS. 1 to 3 are cross sectional views showing steps of a method of manufacturing of a conventional photovoltaic device.
Figure 2:
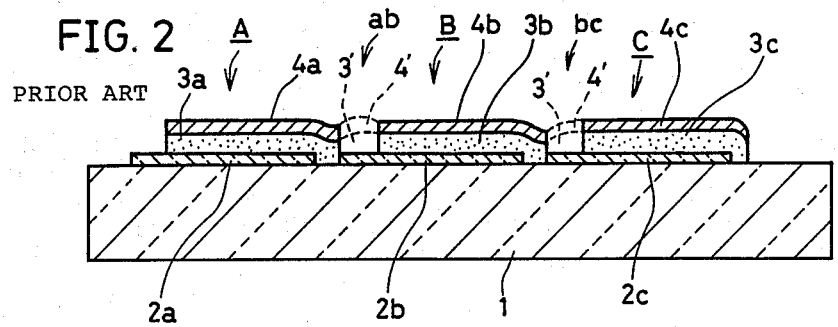
Figure 3:
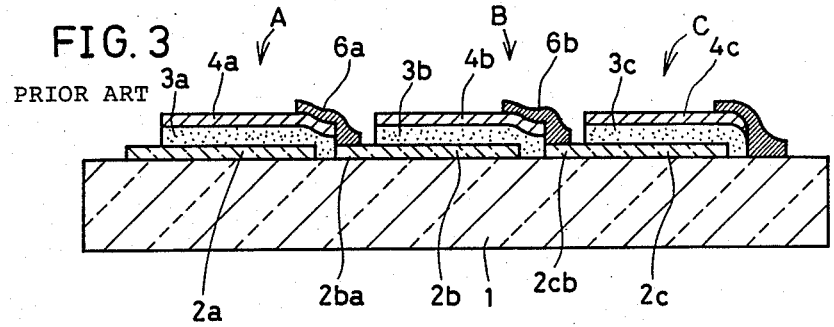
Figure 4:
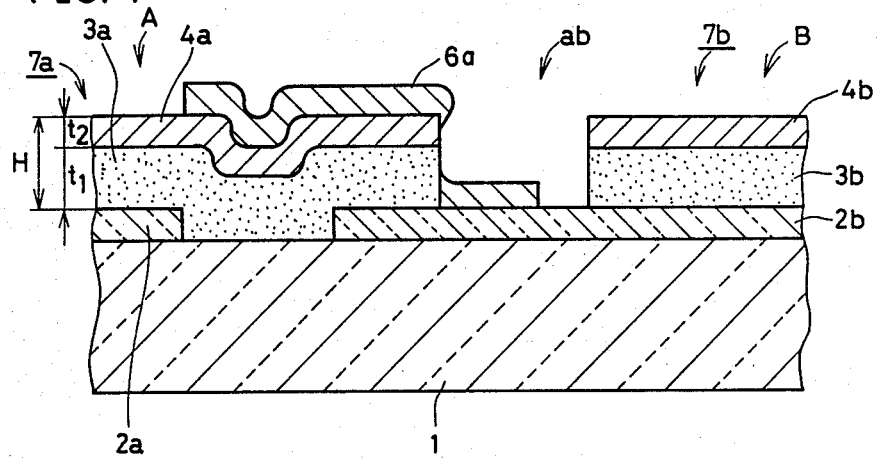
FIGS. 4 and 5 are enlarged sectional views of an essential portion of a conventional photovoltaic device.
Figure 5:
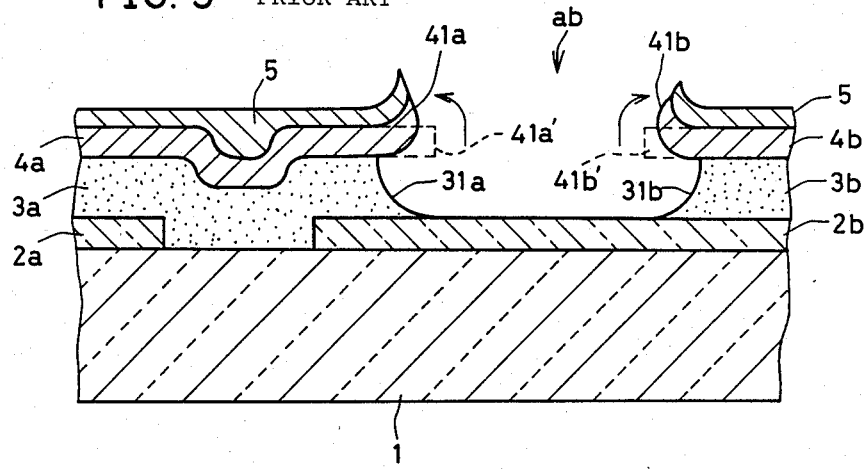
Figure 12:
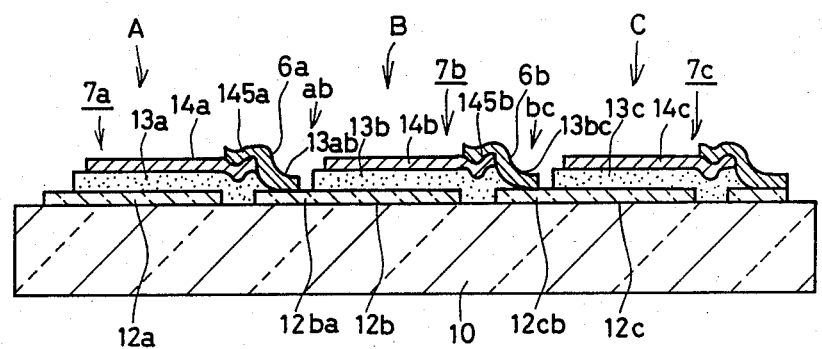
FIG. 12 is a cross sectional view of a photovoltaic device manufactured by a manufacturing method in accordance with the present invention.

FIGS. 6 to 11 are enlarged sectional views showing an essential portion during the major steps of an example of a manufacturing method in accordance with the present invention and FIG. 12 is a cross sectional view of a photovoltaic device manufactured by this example of a manufacturing method in accordance with the present invention.

First, referring to FIGS. 6 to 11, a method of manufacturing of a photovoltaic device in accordance with the present invention will be described. In the step shown in FIG. 6, first electrode films 12a, 12b etc. each comprised of a single layer or multiple layers of transparent conductive oxide such as tin oxide or indium tin oxide are separately disposed on a plurality of regions A, B, etc. of one major surface of an insulating transparent substrate 10. Then, a semiconductor photoactive film layer 13 for generating electrons and/or hole carriers contributing to electric power by application of light and an ohmic second electrode film 14 are provided in an overlapping manner so as to continuously cover the major surface of the substrate 10.

More specifically stated, the semiconductor photoactive layer 13 is a semiconductor of amorphous silicon hydride and includes a PIN junction parallel to the film surface of the light incident side. This layer is formed in the following manner. First, a glow discharge is made to occur in an atmosphere of a silicon compound, for example, an atmosphere of silane gas ($SiH_4$) and methane gas ($CH_4$) mixed with diborane ($B_2H_6$), a P type impurity. Thus, a P type layer having a thickness of approximately 50 Å to 200 Å is formed. Then, an intrinsic (I type) layer having a thickness of approximately 5000 Å to 7000 Å is provided by using only silane gas ($SiH_4$), and an N type layer having a thickness of approximately 100 Å to 500 Å is formed by adding phosphine ($PH_3$), an N type impurity, the I type and N type layers being placed one upon another on the above stated P type layer. Thus, the semiconductor photoactive layer 13 is formed and immediately after that, a second ohmic electrode film 14 comprising a single layer of aluminum (Al) or a laminated structure including a layer of titanium (Ti) or titanium silver alloy (TiAg) on the above stated Al layer is formed.

Figure 7:
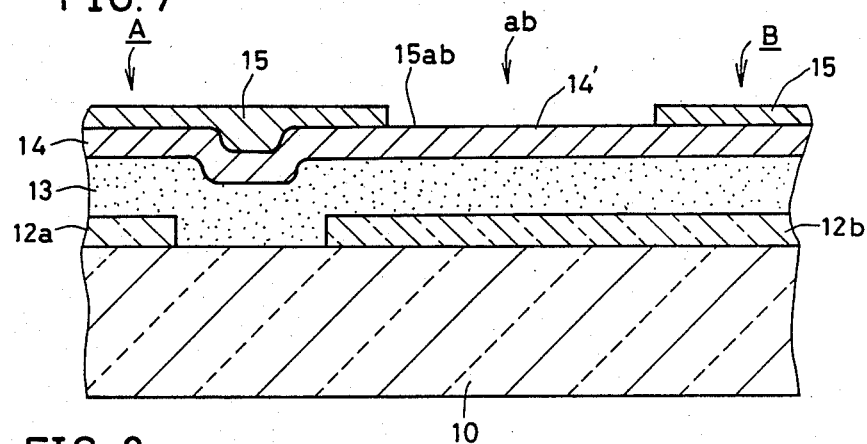

In the step shown in FIG. 7, a photoresist film 15 is provided on the above stated second electrode film 14 so as to serve as a mask for exposing the portion 14' of the second electrode film located in the spacing region ab to be removed, through the opening 15ab. For this photoresist film 15, a rubber resist known in the art is used, for example, "KMR-747" produced by Eastman Kodak Inc., or a dry film such as "Neotroc E" produced by Nitto Electric Co., Ltd. is used. In the latter "Neotroc E", a resist film mainly composed of an acrylic photopolymerization monomer and a film forming polymer is provided on a base film, Japanese patent application No. 37748/1983 having been filed concerning this product by the applicant of the present invention. Particularly, such a dry film resist is suited for a large area etching and is advantageous in that it can be provided by a simplified laminate process instead of a process of coating and baking of a rubber resist and in that it has a large thickness.

Figure 8:
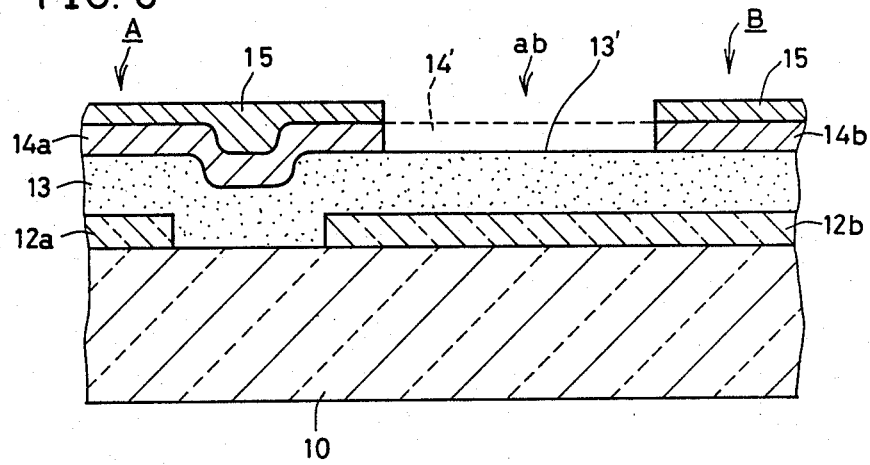

In the step shown in FIG. 8, the second electrode portion 14' in the spacing region ab exposed by the photoresist film 15 is removed by wet etching using a known etching liquid or gas or by dry etching such as plasma etching. Preferably, a dry process of plasma etching using a chlorine containing gas such as $CCl_4$ is employed so that the semiconductor photoactive layer portion 13' in the spacing region ab is exposed.

Figure 9:
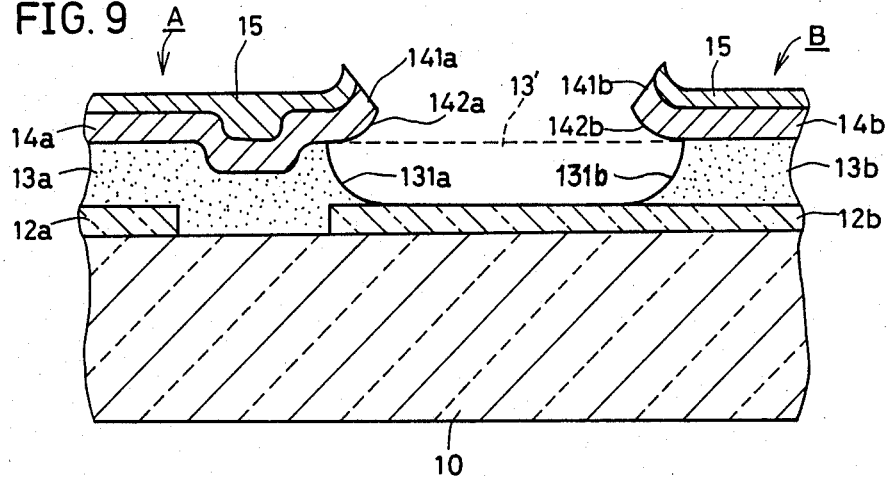

In the step shown in FIG. 9, wet or dry etching is applied to the semiconductor photoactive layer portion 13' exposed by the above stated etching process, using as a mask the remaining photoresist film 15 which was used in the above stated etching process of the second electrode film portion 14'. In this wet or dry etching process, the exposed semiconductor photoactive layer portion 13' in the spacing region ab is removed, so that the semiconductor photoactive layers 13a, 13b etc. are separately provided corresponding to the respective regions A, B etc. Further, the first electrode film 12b in the region B under the semiconductor photoactive layer portion 13' is partially exposed. At this time, the edge portions 141a and 141b of the second electrode films 14a and 14b are curled upward as the result of the overetching of the faces 131a and 131b of the semiconductor photoactive layer portion 13', in the same manner as described previously in connection with the prior art.

Figure 10:
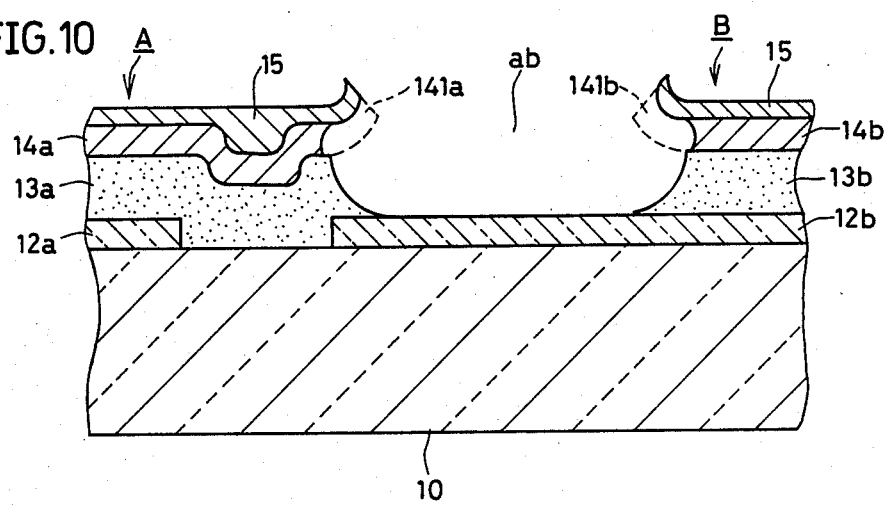

In the step shown in FIG. 10, an etching process is applied again to the second electrode films 14a and 14b. It is to be noted that in this etching process, the photoresist film 15 remains on the surfaces of the second electrode films 14a and 14b to be etched, that is, on the exposed surface side so as to serve as a mask for the surfaces of the second electrode films 14a and 14b, while the contact faces 142a and 142b of the second electrode films 14a and 14b facing the semiconductor photoactive layers 13a and 13b are undercut and exposed as the result of the overetching of the semiconductor photoactive layer portion 13' as shown in FIG. 9. Therefore, if an etching process, and particularly a wet etching process is applied again to the second electrode films 14a and 14b, the second electrode films 14a and 14b are undercut by the etching which is effected from the direction of the contact faces 142a and 142b exposed by the previously stated undercut and the curled edge portions 141a and 141b are removed.

As is clear from FIG. 10, the first electrode film 12b partially exposed in the above stated process has a right end portion covered at least with the semiconductor photoactive layer 13a of the adjacent region, that is, the region A on the left side in FIG. 10. The reason for adopting this structure is as follows. When the right end portion of the first electrode film 12b is exposed by the pattern design directed to the end portion of the semiconductor photoactive layer 13a in the other adjacent region A, water might be left in a small gap between the respective end portions in the subsequent process. The water remaining in this small gap cannot be easily removed. As a result, the remaining water might penetrate into the junction faces between the films as time passes by, which would cause the junction faces to be detached. Therefore, in a photovoltaic device in accordance with the present invention, the end surface of the first electrode film 12b in the spacing region ab is covered with the semiconductor photoactive layer 13a along the whole length thereof so as to prevent such detachment.

Thus, the curled edge portions 141a and 141b are removed by wet etching or the like and subsequently the photoresist film 15 used as the mask is removed by a well known method.

Figure 11:
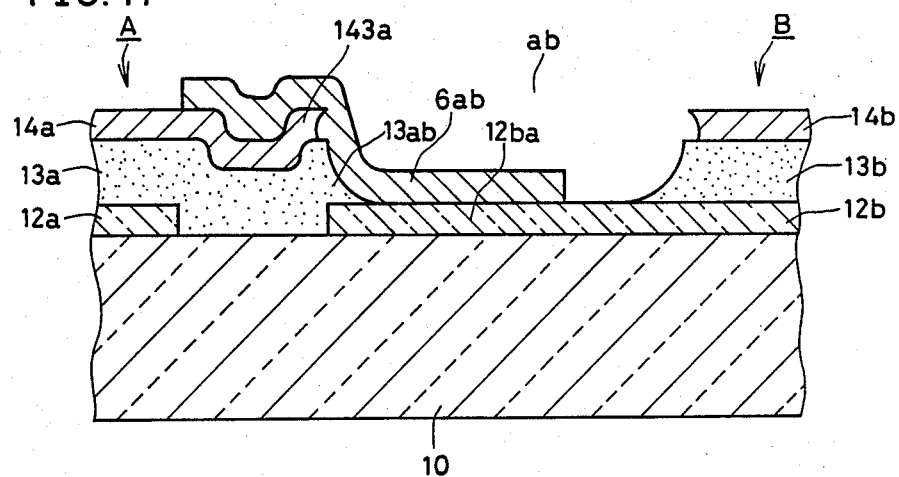

In the final step shown in FIG. 11, a connection electrode film 6ab is selectively evaporated through a metal or ceramic mask so that the exposed portion 12ba of the first electrode film 12b in one region B subjected to the above stated step of etching of the semiconductor photoactive layer portion 13' shown in FIG. 9 is electrically connected with the second electrode film 14a in the adjacent region A, the curled edge portions 141a and 141b of the second electrode films 14a and 14b being removed in the step shown in FIG. 10.

For example, the connection electrode film 6ab has a shape designed so that it does not cover the whole surface of the second electrode film 14a and does not overlap the first electrode film 12a located on the substrate 10 with the semiconductor photoactive layer 13a interposed therebetween. More specifically, if pinholes are generated in the photoresist film 15 in the step shown in FIG. 7, the second electrode film 14a and the semiconductor photoactive layer 13a would be removed by etching through the pinholes in the steps shown in FIGS. 8 and 9 to expose the first electrode film 12a, which film should not be exposed.

Therefore, if the connection electrode film 6ab is provided over the whole surface of the second film 14a, the connection electrode film 6ab would penetrate through the pinholes formed in the second electrode film 14a and the semiconductor photoactive layer 13a so as to be electrically connected with the exposed first electrode film 12a of the photoelectric conversion element 7a. such electrical connection through pinholes would lead to a short circuit of the photoelectric conversion element 7a. This short circuit can be avoided if the connection electrode film 6ab on the second electrode film 14a is located so as not to overlap with the oposed first electrode film 12a with the semiconductor photoactive layer 13a interposed therebetween. In the most suitable embodiment of the evaporated connection electrode film 6ab, a structure of three layers including a lower layer of Ti (or TiAg), an intermediate layer of Al, and an upper layer of Ti (or TiAg) is adopted so as to prevent the oxidation of the face of junction with the first electrode film 12b of a transparent conductive oxide.

Thus, the adjacent two photoelectric conversion elements are electrically connected in series in a manner where the second electrode film 14a on the left and the first electrode film 12b on the right are connected through the connection electrode film 6ab selectively evaporated using a mask. As described previously in connection with the step shown in FIG. 10, the curled edge portions 141a and 141b of the second electrode films 14a and 14b are previously removed by overetching of the semiconductor photoactive layer portion 13'. Consequently, the connection electrode film 6ab extends over the edge portion 143a of the second electrode film 14a, the curled portion thereof being removed, and extends over the slanted concave face 13ab of the semiconductor photoactive layer 13a to reach the exposed surface 12ba of the first electrode film 12b.

Figure 6:
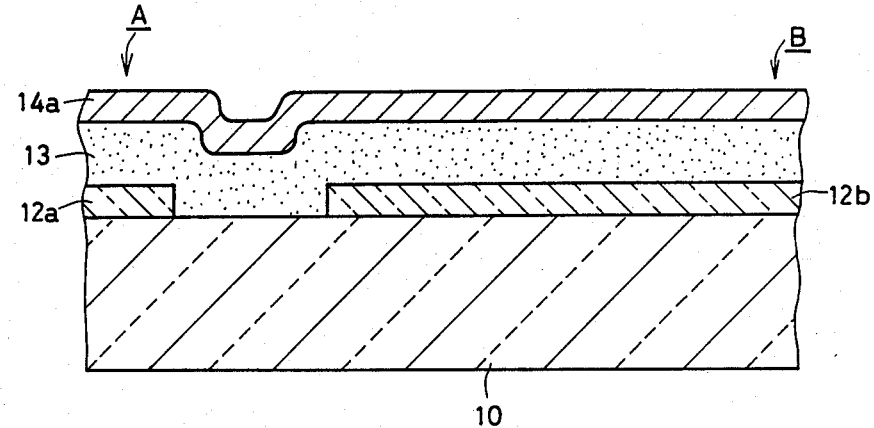
FIGS. 6 to 11 are enlarged sectional views of an essential portion during the major steps of an example of the manufacturing method of a device in accordance with the present invention.

Although in the foregoing, the second electrode film 14 is first provided over the whole area of a plurality of regions A, B . . . in the step shown in FIG. 6 so that a plurality of second electrode films 14a, 14b etc. are separately formed by removing by etching the second electrode film portions 14' in the spacing regions ab in the step shown in FIG. 8, the length of each spacing between the adjacent second electrode films 14a, 14b, etc. serves to determined the exposed length of the exposed portion 12ba necessary for electrical connection with the first electrode films 12b etc. Considering that the exposed length cannot be decreased too much since it serves to decrease the loss of electric power in the connecting portion, another process may be adopted in which the second electrode films 14a, 14b, etc. are selectively evaporated through a mask.

In a photovoltaic device manufactured by the above described manufacturing method, semiconductor photoactive layers 13a, 13b, and 13c are formed at predetermined distances to substantially cover the first electrode films 12a, 12b, and 12c separately disposed in the three regions A, B, and C on one major surface of the substrate 10, as shown in FIG. 12, and on the semiconductor photoactive layers 13a, 13b, and 13c, the second electrode films 14a, 14b, and 14c are formed, whereby the photoelectric conversion elements 7a, 7b, and 7c are formed. The respective photoelectric conversion elements 7a, 7b, and 7c are connected in series by the connection electrode films 6a and 6b.

Figure 13:
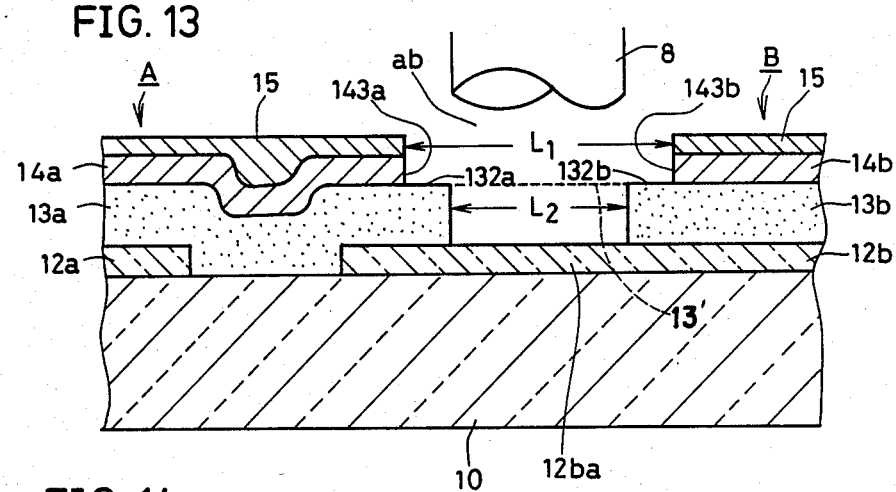
FIGS. 13 and 14 are enlarged sectional views of an essential portion during the major steps of another example of a manufacturing method of a device in accordance with the present invention.
Figure 14:
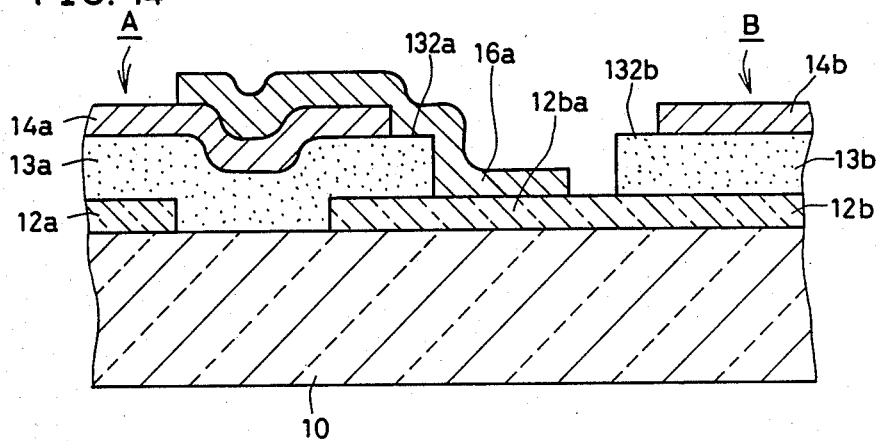
Figure 15:
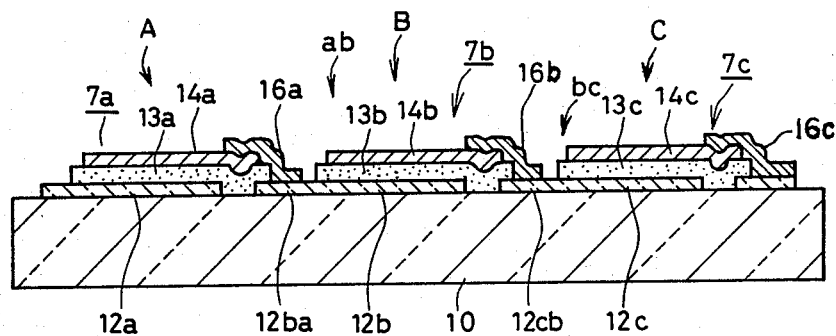
FIG. 15 is a cross sectional view of a photovoltaic device manufactured by another example of a manufacturing method in accordance with the present invention.

FIGS. 13 and 14 are enlarged sectional views of an essential portion during the major steps of another example of a manufacturing method in accordance with the present invention and FIG. 15 is a cross sectional view of a photovoltaic device manufactured by this example of a manufacturing method in accordance with the present invention.

In this manufacturing method of the present invention, first electrode films 12a and 12b, a semiconductor photoactive layer 13, a second electrode film 14, and a photoresist film 15 are formed in the same manner as in the above stated steps shown in FIGS. 6 to 8 and a semiconductor photoactive layer portion 13' is exposed in a spacing region ab by an etching process. Then, in the step shown in FIG. 13, an energy beam 8 such as a laser beam or an electron beam is applied to the semiconductor photoactive layer portion 13' exposed by the above stated etching process. In this case, however the semiconductor photoactive layer portion 13' in the spacing region is removed by application of the energy beam 8. More specifically, in the previously described example shown in FIGS. 6 to 11, the semiconductor photoactive layer portion 13' is removed by wet etching and as a result, the portion 13' is overetched to an extent larger than the removal width $L_1$ defined by the photoresist film 15, which causes the lower faces of the second electrode films 14a and 14b in the vicinity of the spacing region ab to be undercut and curled.

On the other hand, in the example shown in FIG. 13, by application of the energy beam 8, the removal of the portion 13' is made in the thickness direction substantially corresponding to the direction of application of the beam 8, while the removal range does not extend in the direction perpendicular to the direction of application of the beam 8, that is, in the surface direction. Consequently, the semiconductor photoactive layer portion 13' is removed only with a width $L_2$ which is almost equal to the beam width having a sufficient energy density for removal of the semiconductor photoactive layer portion 13'.

For example, the above stated energy beam 8 suited for the removal is a laser beam obtained by a Nd: YAG laser of a wavelength of 1.06 μm with Q switching. Using this laser beam, the a-Si semiconductor photoactive layer portion 13' of a thickness of approximately 5000 Å to 7000 Å is removed within a range of approximately 80 μm to 200 μm by one scanning operation with an energy density of approximately 0.2 J/cm$^2$ to 0.4 J/cm$^2$ and a scanning speed of 30 mm/sec to 80 mm/sec.

The removal width $L_2$ of the semiconductor photoactive layer portion 13' removed in the above stated process is, needless to say, not more than the spacing length $L_1$ between the second electrode films 14a and 14b and is preferably smaller than the spacing length $L_1$. More specifically, if the applied energy beam 8 deviates slightly from the edge portions 143a and 143b of the second electrode film 14a and 14b toward the second electrode films 14a and 14b, the processing energy density threshold value of the second electrode films 14a and 14b in the vicinity of the edge portions of 143a and 143b receiving the energy beam 8 is generally higher than that in the semiconductor photoactive layer portion 13' to be removed and as a result, these second electrode films 14a and 14b are not removed by heating but rather are brought into a melted state. Thus, the second electrode films 14a and 14b in the melted state flow toward the exposed portion 12ba of the first electrode film 12b exposed by removal of the semiconductor photoactive layer portion 13' so as to be in contact therewith, which causes a short circuit between the first electrode film 12b and the second electrode film 14b consisting the same photoelectric conversion element.

Therefore, it is desirable that the removal width $L_2$ may be smaller than the spacing length $L_1$. Thus, it is not necessary to make the scanning of the energy beam 8 strictly coincident with the edge portions 143a and 143b of the second electrode films 14a and 14b and it is only necessary to apply the scanning so that the outer circumference of the energy beam 8 is spaced from the edge portions 143a and 143b toward the side of the spacing region ab. As a result, if the energy beam 8 is moved toward the second electrode film 14a or 14b, this beam 8 is not directly applied to the edge portion 143a and 143b of the second electrode films 14a and 14b.

In the final step shown in FIG. 14, a connection electrode film 16a is selectively evaporated through a metal or ceramic mask so that the exposed portion 12ba of the first electrode film 12b in one region B subjected to the application of the energy beam 8 in the step shown in FIG. 13 is electrically connected with the second electrode film 14a in the other adjacent region A.

Thus, in the adjacent photoelectric conversion elements, the second electrode film 14a in the left adjacent region and the first electrode film 12b in the right adjacent region are electrically connected in series by means of the connection electrode film 6ab selectively evaporated using a mask. In this case, since the semiconductor photoactive layers 13a and 13b are not overetched, the edge portions 143a and 143b of the second electrode films 14a and 14b are not curled and in consequence, rupture does not occur in the connection electrode film 6ab due to such curling. Further, as shown in this example, if the removal width $L_2$ of the semiconductor photoactive layer portion 13' is made smaller than the spacing length $L_1$ of the second electrode films 14a and 14b, the end faces 132a and 132b of the semiconductor photoactive layers 13a and 13b are exposed by the second electrode films 14a and 14b. Particularly, the connection electrode film 6ab extends downward from the left adjacent second electrode film 14a along one end face 132a of the semiconductor photoactive layer 13a and then reaches the exposed portion 12ba of the first electrode film 12b from the end face 132a, not vertically falling directly to the exposed portion 12ba of the right adjacent first electrode film 12b and as a result, the connection electrode film 6ab has a stepped shape. Therefore, as compared with a connection electrode film directly extending vertically downwards, the slant can be made less severe due to the steps. Thus, a large height difference due to a large slant can be mitigated by the steps and defects in the connection of the connection electrode film 6ab due to such a large height difference can be overcome.

More specifically, such defects in the connection can be effectively eliminated because the removal width $L_2$ of the semiconductor photoactive layer 13' removed by the application of the energy beam 8 as shown in FIG. 13 is smaller than the spacing length $L_1$ of the second electrode films 14a and 14b. The appropriate removal width $L_2$ is approximately 90 to 80% of the spacing length $L_1$. Further, if Ti or an alloy containing Ti is used as the material of the connection electrode film 6ab, this Ti serves to effectively avoid defects in the connection, that is, a high frequency of rupture due to a sharp height differences, by making a step-shaped connection.

Before the start of the steps shown in FIGS. 13 and 14, the photoresist film 15 is detached by a well known method. For example, the process shown in FIG. 8 is effected by plasma etching and if a photovoltaic device is to be manufactured by such a dry process, ashing by oxygen plasma is suited for detaching of the photoresist film 15. If the photoresist film 15 is detached after the completion of the step shown in FIG. 13, the photoresist film 15 serves also as a film for preventing sputterings of the semiconductor photoactive layer portion 13' due to application of the energy beam 8 from being deposited onto the second electrode films 14a and 14b.

A photovoltaic device manufactured by the above stated manufacturing method comprises the photoelectric conversion elements 7a, 7b, and 7c having a laminated structure as shown in FIG. 15 wherein the first electrode films 12a, 12b, and 12c, the semiconductor photoactive layers 13a, 13b, and 13c, and the second electrode films 14a, and 14b, and 13c are formed respectively in the regions A, B, and C on the substrate 10. The connection electrode films 16a and 16b are provided to extend from the respective second electrode films 14a, 14b and 14c along the slanted portions of the semiconductor photoactive layers 13a, 13b and 13c toward the exposed portions 12ba and 12cb of the first electrode films 12b and 12c in the adjacent regions, whereby the photoelectric conversion elements 7a, 7b and 7c are connected in series.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A photovoltaic device comprising:
   a substrate,
   a plurality of photoelectric conversion elements formed on said substrate and each comprising in succession from said substrate a first electrode film, a semiconductor photoactive layer, and a second electrode film, and
   connection electrode films for electrically connecting adjacent photoelectric conversion elements in series, wherein in the spaces between adjacent photoelectric conversion elements, one end of each said connection electrode film overlies a portion of the second electrode film of one of the adjacent photoelectric conversion elements and extends downward along the side face of the semiconductor photoactive layer exposed by said second electrode film of said photoelectric conversion element and the other end of each said connection electrode film extends to and contacts the exposed portion of said first electrode film of the other one of the adjacent photoelectric conversion elements,
   said side face of said semiconductor photoactive layer being made slanted via overetching, and
   each said connection electrode film extends downward along said slanted side face; and
   each said connection electrode film makes electric connection with the second electrode film of said one of the adjacent photoelectric conversion elements such that the associated terminating end of said connection electrode film is not overlying the first electrode film of said one of the adjacent photoelectric conversion elements.

2. A photovoltaic device in accordance with claim 1, wherein
   each said first electrode film is formed of either a transparent oxide electrode material or aluminum.

3. A photovoltaic device in accordance with claim 1, wherein
   each said second electrode film is formed of either a transparent oxide electrode material or aluminum.

4. A photovoltaic device in accordance with claim 1, wherein
   said connection electrode film comprises an acid-resisting metal.

5. A photovoltaic device in accordance with claim 1, wherein
   an edge face of each one of said first electrode films is covered with said semiconductor photoactive layer.

6. A photovoltaic device comprising:
   a substrate;
   a plurality of photoelectric conversion elements formed on said substrate, and each comprising in succession from said substrate a first electrode film, a semiconductor photoactive layer, and a second electrode film;
   connection electrode films for electrically connecting adjacent photoelectric conversion elements in series, wherein in the spaces between adjacent photoelectric conversion elements, one end of each one of said connection electrode films overlies a portion of the second electrode film of one of the adjacent photoelectric conversion elements and extends downward along the side face of the semiconductor photoactive layer exposed by said second electrode film of said photoelectric conversion element, and the other end of each said connection electrode film extends to and contacts the exposed portion of said first electrode film of the other one of the adjacent photoelectric conversion elements;
   said side face of said semiconductor photoactive layer extends downwardly vertically due to formation of application of an energy beam; and
   each said connection electrode film extends along and in contact with a portion of the upper surface of the semiconductor photoactive layer exposed by said second electrode film and along the side face of said semiconductor photoactive layer vertically extending downward.

7. A photovoltaic device in accordance with claim 6, wherein each said connection electrode film makes electric connection with the second electrode film of said one of the adjacent photoelectric conversion elements such that the associated terminated end of said connection electrode film is not overlying the first electrode film of said one of the adjacent photoelectric conversion elements.

8. A photovoltaic device in accordance with claim 6, wherein each said first electrode film is formed of either a transparent oxide electrode material or aluminum.

9. A photovoltaic device in accordance with claim 6, wherein each said second electrode film is formed of either a transparent oxide electrode material or aluminum.

10. A photovoltaic device in accordance with claim 6, wherein said connection electrode film comprises an acid-resisting metal.

11. A photovoltaic device in accordance with claim 6, wherein an edge face of each one of said first electrode films is covered with said semiconductor photoactive layer.

12. A photovoltaic device comprising:
    a substrate;
    a plurality of photoelectric conversion elements formed on said substrate, and each comprising in succession from said substrate a first electrode film, a semiconductor photoactive layer, and a second electrode film;
    connection electrode films for electrically connecting adjacent photoelectric conversion elements in series, wherein in the spaces between adjacent photoelectric conversion elements, one end of each one of said connection electrode films overlies a portion of the second electrode film of one of the adjacent photoelectric conversion elements and extends downward along the side face of the semiconductor photoactive layer exposed by said second electrode film of said photoelectric conversion element, and the other end of each said connection electrode film extends to and contacts the exposed portion of said first electrode film of the other one of the adjacent photoelectric conversion elements; and
    each said connection electrode film makes electric connection with the second electrode film of said one of the adjacent photoelectric conversion elements such that the associated terminated end of said connection electrode film is not overlying the first electrode film of said one of the adjacent photoelectric conversion elements.

13. A photovoltaic device in accordance with claim 12, wherein said side face of said semiconductor photoactive layer is slanted due to overetching, and each said connection electrode film extends downward along said slanted side face.

14. A photovoltaic device in accordance with claim 12, wherein said side face of said semiconductor photoactive layer extends downward vertically due to formation by application of an energy beam, and each said connection electrode film extends along and in contact with a portion of the upper surface of the semiconductor photoactive layer exposed by said second electrode film and along the side face of said semiconductor photoactive layer vertically extending downward.

15. A photovoltaic device in accordance with claim 12, wherein each said first electrode film is formed of either a transparent oxide electrode material or aluminum.

16. A photovoltaic device in accordance with claim 12, wherein each said second electrode film is formed of either a transparent oxide electrode material or aluminum.

17. A photovoltaic device in accordance with claim 12, wherein said connection electrode film comprises an acid resisting metal.

18. A photovoltaic device in accordance with claim 12, wherein an edge face of each one of said first electrode films is covered with said semiconductor photoactive layer.

* * * * *